(12) United States Patent
Kuribara (10) Patent No.: US 8,530,836 B2
(45) Date of Patent: Sep. 10, 2013

(54) ELECTRON-BEAM DIMENSION MEASURING APPARATUS AND ELECTRON-BEAM DIMENSION MEASURING METHOD

(75) Inventor: Masayuki Kuribara, Tokyo (JP)

(73) Assignee: Advantest Corp., Tokyo (JP)

( * ) Notice: Subject to any disclaimer, the term of this patent is extended or adjusted under 35 U.S.C. 154(b) by 72 days.

(21) Appl. No.: 12/380,964

(22) Filed: Mar. 5, 2009

(65) Prior Publication Data

US 2009/0242800 A1    Oct. 1, 2009

Related U.S. Application Data

(63) Continuation of application No. PCT/JP2007/066838, filed on Aug. 30, 2007.

(30) Foreign Application Priority Data

Sep. 5, 2006  (JP) .................................. 2006-240529

(51) Int. Cl.
*H01J 37/28* (2006.01)
(52) U.S. Cl.
USPC ............................ 250/310; 250/306; 250/307
(58) Field of Classification Search
USPC ................. 250/306, 307, 308, 309, 310, 311, 250/396 R, 440.11, 397, 396 ML
See application file for complete search history.

(56) References Cited

U.S. PATENT DOCUMENTS

2006/0163480 A1* 7/2006 Koyama et al. ............... 250/310
2006/0289755 A1* 12/2006 Koyama et al. ............... 250/310

FOREIGN PATENT DOCUMENTS

| JP | 63-006737 | 1/1988 |
| JP | 04-218941 | 8/1992 |
| JP | 05-290789 | 11/1993 |
| JP | 11-354621 | 12/1999 |
| JP | 2005-164451 | 6/2005 |
| JP | 2005-174591 | 6/2005 |
| JP | 2007-078537 | 3/2007 |
| WO | WO 02/01596 | 1/2002 |

* cited by examiner

*Primary Examiner* — Robert Kim
*Assistant Examiner* — Hanway Chang
(74) *Attorney, Agent, or Firm* — Muramatsu & Associates (57) ABSTRACT

An electron-beam dimension measuring apparatus includes: electron-beam irradiating means for irradiating a surface of a sample with an electron beam; a stage on which the sample is placed; a photoelectron generating electrode disposed so as to face the sample; ultraviolet light irradiating means for emitting ultraviolet light; and control means for causing the ultraviolet light irradiating means to irradiate the sample and the photoelectron generating electrode with the ultraviolet light for a predetermined length of time, to cause the sample and the photoelectron generating electrode to emit photoelectrons, for applying a voltage to the photoelectron generating electrode, the voltage applied to supply energy corresponding to a difference between energy of photoelectrons emitted by the sample and energy of photoelectrons emitted by the photoelectron generating electrode, and thereby for controlling an electric potential of the surface of the sample to set the electric potential at 0 V. The control means measures the dimension of the sample after keeping the electric potential constant on the surface of the sample.

10 Claims, 6 Drawing Sheets

ELECTRON-BEAM DIMENSION MEASURING APPARATUS AND ELECTRON-BEAM DIMENSION MEASURING METHOD

CROSS-REFERENCE TO RELATED APPLICATIONS

This application is a continuation of prior International Patent Application No. PCT/JP2007/066838, filed Aug. 30, 2007, the entire contents of which are incorporated herein by reference.

BACKGROUND OF THE INVENTION

1. Field of the Invention

The present invention relates to an electron-beam dimension measuring apparatus and an electron-beam dimension measuring method for observing a sample by irradiating the sample with an electron beam.

2. Description of the Prior Art

In a process of manufacturing a semi-conductor device, a sample is observed, and a line width and the like of a pattern are measured, with use of an electron beam apparatus such as an electron microscope. When a sample is observed and measured with use of an electron beam apparatus, the electron beam apparatus scans a portion to be observed while irradiating the portion with the electron beam, and thus converts the amount of secondary electrons and the like to luminance. As an image, the converted luminance is displayed on a display unit.

Such irradiation of the sample with the electron beam in the observation and measurement of the sample causes a phenomenon that a surface of the sample is electrostatically charged. Specifically, the surface which is irradiated with the electron beam is positively or negatively charged depending on the difference in electric charge between charged particles incident onto the sample and charged particles emitted from the sample. Once the surface of the sample is charged, the secondary electrons emitted from the sample are accelerated, or are drawn back to the sample. This changes efficiency of the secondary electron emission, and causes a problem that the an image of the surface of the sample fluctuates. In addition, if the electrostatic charge continues on the surface of the sample, primary electron beams may be deflected, and accordingly the image may be distorted.

To overcome these problems, various proposals have been made on a method of preventing electrostatic charge of a sample.

As a related technique, Japanese Unexamined Patent Application Publication No. Hei 4-218941 discloses an apparatus irradiating a gas in a housing with ultraviolet light, thus ionizing the gas, and blowing the ionized gas on a sample, thereby neutralizing the sample. In addition, Japanese Patent Application Publication No. 2005-174591 discloses an apparatus irradiating a sample with ultraviolet light, thus causing the irradiated sample to emit photoelectrons, thereby neutralizing the negative charge of the sample.

When a sample is observed with use of an electron-beam apparatus, as described above, irradiation of a sample with an electron beam causes a phenomenon that the sample is electrostatically charged. However, in a case where a sample can be electrically connected, for instance, like a wafer, it is possible to ground a conductor on the electrically connected wafer to prevent the phenomenon that the sample is electrostatically charged. For this reason, no specific problem occurs in this case.

However, there are such cases that the sample may be non-conductive, and that the sample cannot be grounded even though a conductive material is used for the sample. In these cases, the sample is in an electrically floating state, causing the sample to be electrostatically charged.

For instance, when the dimension of a photomask used as a master disc for exposing a semiconductor to light is measured, the sample is electrostatically charged in the following two states: the first state in which a conductor such as chromium is present entirely on a glass substrate in the middle of a step of manufacturing interconnections, and resist interconnections for etching interconnections in the chromium are present on the conductor; and the second state in which the step of manufacturing the interconnections is completed, so that the interconnections made of the conductor such as chromium are present on the glass substrate.

In particular, immediately before the chromium starts to be etched, the layer made of the conductor such as chromium is present entirely on the glass substrate. When a portion on the conductor layer is irradiated with an electron beam, once electrostatic charge occurs, the entire conductor layer on the substrate is electrostatically charged. This electrostatic charge adversely affects observation of any other portion and measurement of a dimension of the portion. Furthermore, even when the amount of electrostatic charge of a single portion is very slight, if irradiation is performed on hundreds to thousands of portions with an electron beam, the total amount of electrostatic charge of the conductor layer eventually becomes large. This makes the dimension measured at the beginning lose its correlation with the dimension measured at the last.

An experiment by the inventors revealed that, as an example of this dimensional change, a 2-μm dimension changes by 6 nm when the electric potential of the surface of the sample changes by 10 V, where the irradiation energy of an electron beam is 1500 eV.

However, an electron-beam dimension measuring apparatus is required to have the dimensional accuracy that an error is equal to or less than 1 nm when the dimension is 2 μm. For this reason, in a case where the irradiation energy is 1500 eV, an allowable change in electric potential of the surface of the sample is approximately 1.7 V at maximum.

Furthermore, when the dimension of a resist material is measured in a step included in an interconnection rendering process, a common practice is that the irradiation energy of the electron beam is reduced to approximately 500 eV for the purpose of avoiding damage to the resist material. In this case, the change in electric potential of the surface of the sample needs to be equal to or less than approximately 0.6 V for the purpose of satisfying the requirement of the dimensional accuracy.

Moreover, depending on the resist materials, the irradiation energy needs to be reduced to approximately 400 eV or 300 eV because some resist materials have higher damage sensitivity to the electron beam. For this reason, it is desirable that the change in electric potential of the surface of the sample should be close to 0 V.

Note that in the method of controlling the electrostatic charge of the surface of the sample by use of ultraviolet light, it is difficult to keep the electric potential constant at 1 V or less on the surface of the sample with high accuracy.

SUMMARY OF THE INVENTION

The present invention has been made by taking the problems of the conventional techniques into consideration. An object of the present invention is to provide an electron-beam dimension measuring apparatus and an electron-beam dimension measuring method both making it possible to measure a sample with high accuracy by maintaining electric potential constant at 1 V or less on the sample made of a conductor which is not electrically connectable or the sample made of insulation material.

The above-described problems are solved by an electron-beam dimension measuring apparatus including: electron-beam irradiating means for irradiating a surface of a sample with an electron beam; a stage on which the sample is placed; a photoelectron generating electrode disposed so as to face the sample; ultraviolet light irradiating means for emitting ultraviolet light; and control means for causing the ultraviolet light irradiating means to irradiate the sample and the photoelectron generating electrode with the ultraviolet light for a predetermined length of time, to cause the sample and the photoelectron generating electrode to emit photoelectrons, applying a voltage to the photoelectron generating electrode, the voltage applied to supply energy corresponding to a difference between energy of photoelectrons emitted by the sample and energy of photoelectrons emitted by the photoelectron generating electrode, and thereby controlling an electric potential of the surface of the sample to set the electric potential at 0 V.

In the electron-beam dimension measuring apparatus, the predetermined length of time may be a length of time required until a first measurement value and a second measurement value become equal to each other, the first measurement value obtained by measurement of a dimension by use of a calibration sample made of the same material of the sample and having a known dimension, the second measurement value obtained by measuring a dimension of the sample after irradiating the sample with the ultraviolet light.

The electron-beam dimension measuring apparatus may further include an objective lens, and the control means may cause the ultraviolet light irradiating means to emit the ultraviolet light without applying any voltage to the objective lens.

Otherwise, the control means causes the ultraviolet light irradiating means to irradiate, with the ultraviolet light, a range which is not influenced by an electric field generated by applying a voltage to the objective lens, in the sample and photoelectron generating electrode.

In the present invention, before the dimension of the sample is measured, the electric potential on the sample is controlled to be set at 0V. For the purpose of keeping this electric potential constant, the predetermined voltage is applied to the photoelectron generating electrode which can be grounded while being disposed so as to face the sample, and both the sample and the photoelectron generating electrode are irradiated with ultraviolet light. As a result of the irradiation with the ultraviolet light, photoelectrons are emitted from the sample and the photoelectron generating electrode. However, with a value representing the voltage applied to the photoelectron generating electrode, the electric potential of the surface of the sample is controlled to be 0 V. The voltage applied to the photoelectron generating electrode is a voltage for supplying energy corresponding to the difference between energy of photoelectrons emitted by the sample due to the irradiation with the ultraviolet light and energy of photoelectrons emitted by the photoelectron generating electrode due to the irradiation with the ultraviolet light. Thereby, the electron beam is no longer influenced by a different electric potential on the surface of the sample, and accordingly the irradiation range of the electron beam no longer changes. This makes it possible to measure the dimension of the sample stably.

Moreover, another embodiment of the present invention provides an electron-beam dimension measuring method for an electron-beam dimension measuring apparatus including: electron-beam irradiating means for irradiating an electron beam onto a surface of a sample; a stage on which the sample is placed; a photoelectron generating electrode disposed so as to face the sample; and ultraviolet light irradiating means for emitting ultraviolet light, the method including the steps of: finding a voltage to be applied to the photoelectron generating electrode; applying the voltage to the photoelectron generating electrode, irradiating the sample and the photoelectron generating electrode with the ultraviolet light for a predetermined length of time, and thereby controlling an electric potential of the sample to set the electric potential at 0 V; and measuring a dimension of the sample after controlling the electric potential of the sample to set the electric potential at 0 V.

DESCRIPTION OF THE PREFERRED EMBODIMENTS

Descriptions will be hereinbelow provided for the embodiments of the present invention by referring to the drawings.

First of all, descriptions will be provided for a configuration of an electron-beam dimension measuring apparatus. Subsequently, descriptions will be provided for a process for keeping an electric potential of a surface of a sample constant, which is a characteristic of the present invention. Thereafter, descriptions will be provided for an electron-beam dimension measuring method using the electron-beam dimension measuring apparatus.

(Configuration of Electron-beam Dimension Measuring Apparatus)

Figure 1:
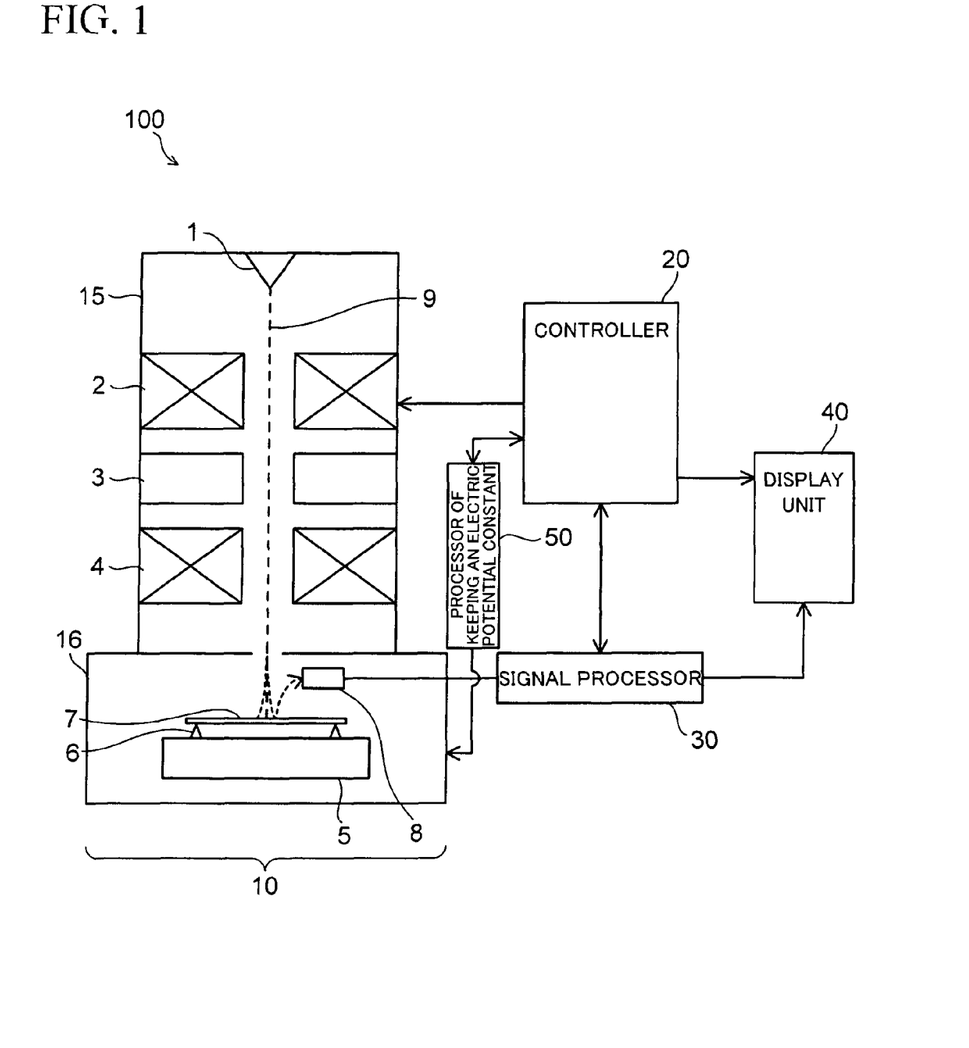
FIG. 1 is a block diagram of an electron-beam dimension measuring apparatus used for an embodiment of the present invention.

FIG. 1 is a block diagram of the electron-beam dimension measuring apparatus according to the present embodiment.

The electron-beam dimension measuring apparatus 100 is roughly divided into: an electron scanner 10; a signal processor 30; a display unit 40; a processor 50 for keeping an electric potential constant; and a controller 20 for controlling the electron scanner 10, the signal processor 30, the display unit 40 and the processor 50 for keeping an electric potential constant. The electron scanner 10 includes an electron lens barrel part (column) 15 and a sample chamber 16.

The electron lens barrel part 15 includes an electron gun (electron beam irradiating means) 1, a condenser lens 2, a deflection coil 3 and an objective lens 4. The sample chamber 16 includes a stage 5 and a sample supporting part 6 including an insulating material.

A motor (not illustrated) for moving the stage 5 and a vacuum pump (not illustrated) for keeping the inside of the sample chamber 16 in a predetermined decompression atmosphere are connected to the sample chamber 16.

Figure 2:
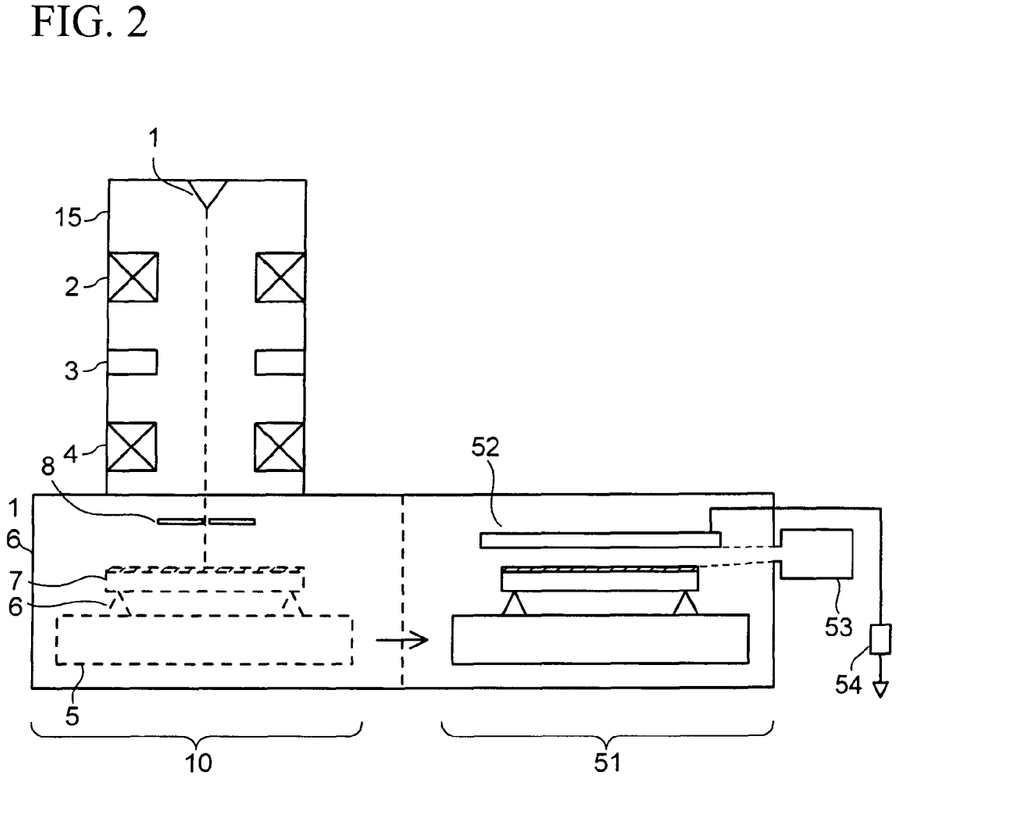
FIG. 2 is a diagram (Part 1) showing a processor for keeping an electric potential constant in the electron-beam dimension measuring apparatus shown in FIG. 1.

The processor 50 for keeping an electric potential constant includes a process chamber 51 for keeping an electric potential constant in which a process of keeping an electric potential of a sample constant is performed. As shown in FIG. 2, the process chamber 51 for keeping an electric potential constant includes an ultraviolet light irradiator 53 and a photoelectron generating electrode 52. The photoelectron generating electrode 52 is disposed so as to face a sample 7. In addition, it is desirable that the photoelectron generating electrode 52 should be large enough to cover an entire surface of the sample 7.

The electron gun 1 is configured to emit an electron beam 9 onto the sample 7 placed on the stage 5 through the condenser lens 2, the deflection coil 3, and the objective lens 4. Note that, if an electrostatic lens is provided in an end portion of the objective lens which is opposite to the sample 7, an electron probe with a low-accelerated voltage can be obtained by decelerating electrons accelerated in the lens barrel by use of the electrostatic lens.

The amount of secondary electrons or reflection electrons coming out from the sample 7 as a result of the irradiation of the electron beam 9 is detected by an electron detector 8 configured with a secondary electron controlling electrode, a scintillator and the like. The signal processor 30 converts the amount of detection to a digital amount with use of an AD converter, and further converts the digital amount to a signal representing luminance, so that the signal is displayed on the display unit 40. The controller 20 controls the amount of electrons deflected by the deflection coil 3 and the amount of scanning an image on the display unit 40.

The controller 20 is configured of a microcomputer. A program for performing a length measurement process is stored in the controller 20. Furthermore, the controller 20 determines a voltage for accelerating the electron beam 9, and thus applies the determined acceleration voltage to the electron gun 1 electrically connected to the controller 20. Moreover, the controller 20 stores a program for determining a value of a voltage applied to the photoelectron generating electrode 52, for causing the ultraviolet irradiator 53 to irradiate the ultraviolet light, and thereby keeping the electric potential of the sample 7 constant.

FIG. 2 is a diagram showing a process chamber 51 for keeping an electric potential constant. The process chamber 51 for keeping an electric potential constant controls the electric potential of the surface of the sample 7 placed on the stage 5 in order that the electric potential thereof can be controlled to 0 V. In the present embodiment, the process chamber 51 for keeping an electric potential constant is provided separately from the sample chamber 16. The stage 5 is moved into the process chamber 51 for keeping an electric potential constant, and thus the electric potential of the sample 7 is controlled.

The electron-beam dimension measuring apparatus 100 configured in the above-described manner controls the electric potential of the surface of the sample 7 placed on the stage 5 in order that the electric potential thereof can be controlled to 0 V, before observing or performing the length measurement process on the sample 7. After completing this control, the electron-beam dimension measuring apparatus 100 moves the sample 7 into the sample chamber 16, and observes the sample 7 or performs the length measurement process on the sample 7.

(Process for Keeping Electric Potential of Surface of Sample Constant)

Descriptions will be provided for the process for keeping an electric potential of a surface of a sample constant, which is carried out before the sample is observed, or before a length measurement process is performed on the sample. First, descriptions will be provided as to how a sample is electrostatically charged. Thereafter, descriptions will be provided for a theory and method of keeping an electric potential of a sample constant.

(How Sample is Electrostatically-charged)

Figure 3:
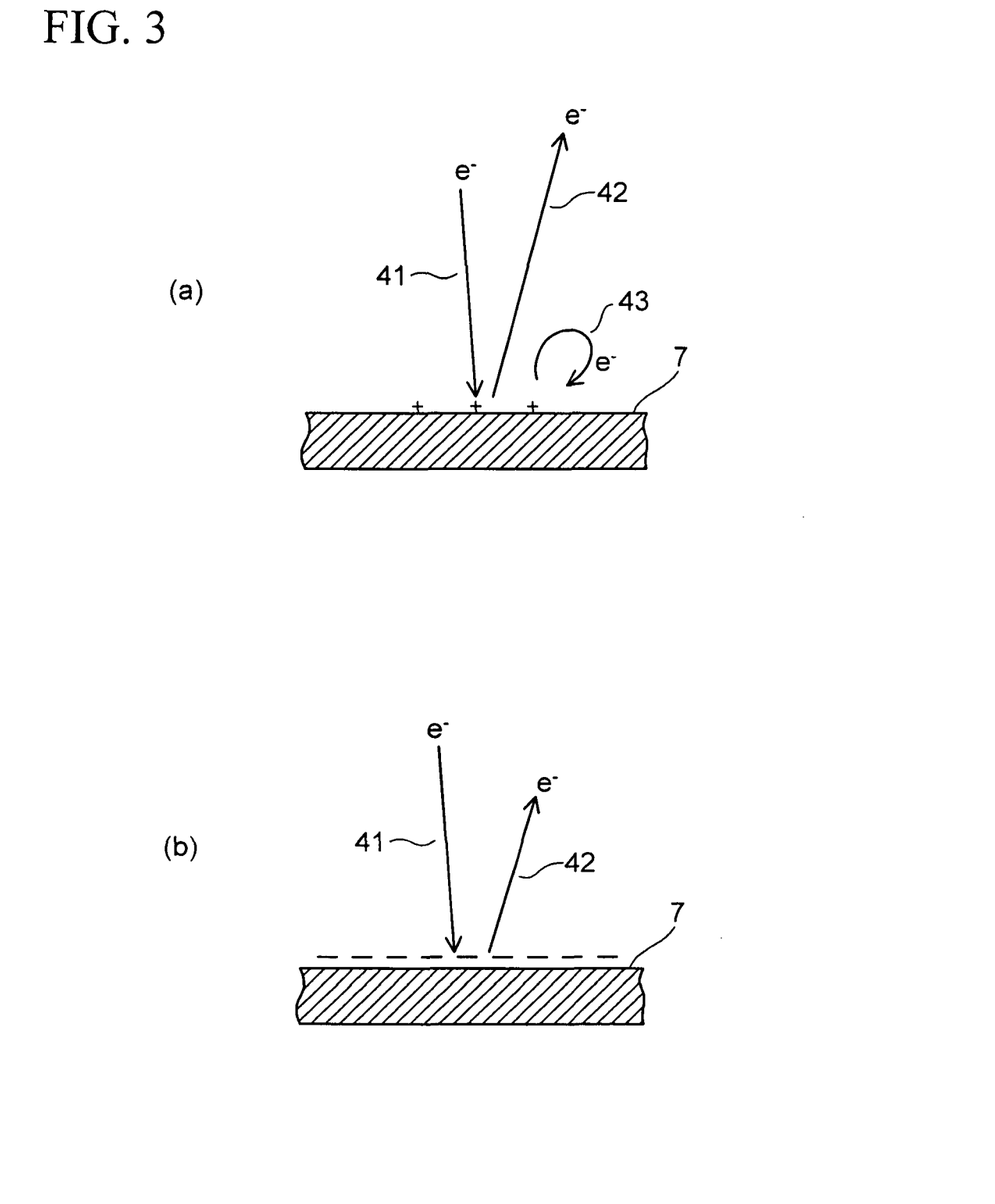
FIG. 3 is a diagram showing a relationship between a secondary-electron emission ratio and an electrostatically charged state of a surface of an insulating film.

FIG. 3 is a diagram schematically showing how a surface of an insulating film or a metal surface in a floating state is electrostatically charged. FIG. 3(*a*) shows a case where a secondary electron emission ratio is larger than 1 (one). When the secondary electron emission ratio is in a range larger than 1 (one), the number of electrons 42 emitted from the sample 7 exceeds the number of electrons 41 falling onto the sample 7. Consequently, the surface of the sample 7 is positively charged. On the other hand, FIG. 3(*b*) shows a case where the secondary electron emission ratio is smaller than 1 (one). When the secondary electron emission ratio is in a range smaller than 1 (one), the number of electrons remaining on the surface of the sample 7 becomes larger. Consequently, the surface of the sample 7 is negatively charged.

In a case where energy of primary electrons is sufficiently large and the secondary electron emission ratio is smaller than 1 (one), the surface of the sample 7 is negatively charged. For this reason, the primary electrons are decelerated near the sample 7. This electrostatic charge continues until the secondary electron emission ratio comes close to 1 (one).

By contrast, in a case where the secondary electron emission ratio is larger than 1 (one), the surface of the sample 7 is positively charged. When the amount of electrostatic charge of the surface of the sample 7 reaches several volts, the secondary electrons 43 each having energy of several eV start to be drawn back to the surface of the sample 7. Once an incident electric current caused by combination of the primary electrons and the drawn-back secondary electrons is balanced with an emission electric current caused by the emitted secondary electrons, the electrostatic charge no longer continues.

Once the electrostatic charge is balanced, change in electric potential of the surface of the sample is suppressed. In a conventional technique, the change in electric potential thereof is suppressed in such a manner that energy of the emitted electron beam is changed so that the electric potential of the surface of the sample is positively or negatively charged. In this respect, by setting the secondary electron emission ratio at 1 (one), an acceleration voltage is so set to prevent the surface of the sample from being electrostatically charged. However, the acceleration voltage which makes the emission ratio of the secondary electrons 42 equal to 1 (one) varies depending on the material of the sample 7. For this reason, the acceleration voltage which makes the emission ratio of the secondary electrons equal to 1 (one) has to be found by adjusting the acceleration voltage. This makes it difficult to determine the acceleration voltage. In addition, it is difficult to control the electrostatic charge with accuracy of 1 V or less.

(Theory and Method of Keeping Electric Potential of Sample Constant)

The present embodiment focuses on an electrode disposed so as to face the sample 7 for the purpose of controlling the electric potential of the sample 7, and on a voltage applied to the electrode, in a case where the sample 7 cannot be grounded.

Here, descriptions will be provided for a theory for keeping the electric potential of the surface of the sample 7 constant at 0 V when the material for the sample 7 is chromium (Cr) and the material for the photoelectron generating electrode 52 disposed to face the sample 7 is nickel (Ni).

Figure 4:
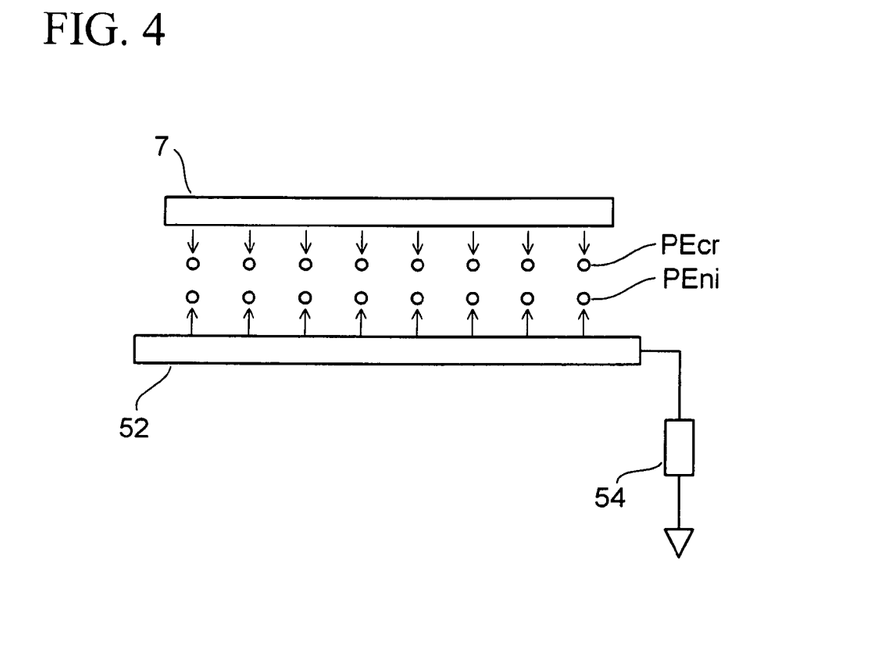
FIG. 4 is a diagram used to explain a theory for keeping an electric potential of a sample constant.

FIG. 4 is a diagram showing a process for keeping the electric potential of the sample 7 constant when: the sample 7 and the photoelectron generating electrode 52 are disposed to face each other; the electric potential of the photoelectron generating electrode 52 is controlled by a voltage controller 54; and the ultraviolet light irradiator 53 emits ultraviolet light on the sample 7.

In FIG. 4, reference letter PEcr denotes a photoelectron emitted from the sample 7, and reference letter PEni denotes a photoelectron emitted from the photoelectron generating electrode 52. For emission of photoelectrons from a metal on the basis of a photoelectric effect, the work function of the metal needs to be equal to or less than a value representing energy of light emitted onto the metal. Assume that, for instance, ultraviolet light with a wavelength of 250 nm is emitted onto a metal. The energy of ultraviolet light with this wavelength is 4.90 eV. As long as the work function of the metal is equal to or less than this value, photoelectrons are emitted from the metal when the ultraviolet light is emitted onto the metal.

The work function Wni of nickel is 4.6 eV, whereas the work function Wcr of chromium is 4.4 eV. Consequently, when the sample 7 and the photoelectron generating electrode 52 are irradiated with the ultraviolet light, photoelectrons PEcr and PEni are emitted from the surfaces of the sample 7 and the photoelectron generating electrode 52, respectively.

The energy Eni of the photoelectrons emitted from the photoelectron generating electrode 52 is calculated as 4.9−4.6=0.3 eV. The energy Ecr of the photoelectrons emitted from the sample 7 is calculated as 4.9−4.4=0.5 eV.

In this respect, the difference in electric potential between the sample 7 and the photoelectron generating electrode 52 is represented by $\Delta V$.

Energy of each of the photoelectrons emitted from the sample 7 and the photoelectron generating electrode 52 increases or decreases when the photoelectron is accelerated or decelerated due to $\Delta V$. In this respect, at the center position between the sample 7 and the photoelectron generating electrode 52, energy of photoelectrons emitted from the sample 7 is equal to the sum Ecr1 of energy Ecr given at the time of emission and energy $-\Delta V/2$ accelerated until the center position. Similarly, at the center position, energy of photoelectrons emitted from the photoelectron generating electrode 52 is equal to the sum Eni1 of energy Eni at the time of emission and $\Delta V/2$.

$$Eni1 = Eni + \Delta V/2$$

$$Ecr1 = Ecr - \Delta V/2$$

It is considered that when Ecr1=Eni1, the amount of movement of each photoelectron is equal to 0 (zero).

Eni1=Ecr1 can be replaced with Eni+$\Delta V/2$=Ecr−$\Delta V/2$. Eni+$\Delta V/2$=Ecr−$\Delta V/2$ can be converted to $\Delta V$=Ecr−Eni. In this respect, we have assumed that the photoelectron emitted from the sample 7 and the photoelectron emitted from the photoelectron generating electrode 52 are located at the center position therebetween. Regardless of this assumption, however similarly, $\Delta V$=Ecr−Eni is a condition which satisfies Eni1=Ecr1 when a photoelectron emitted from the sample 7 and a photoelectrons emitted from the photoelectron generating electrode 52 overlap each other at any other single position.

Next, let us discuss conditions which satisfy $\Delta V \neq$Ecr−Eni. If $\Delta V$>Ecr−Eni, Eni1>Ecr1. In this case, photoelectrons move in a direction from the photoelectron generating electrode 52 to the sample 7. Consequently, the movement of photoelectrons acts on $\Delta V$ in such a direction that the electric potential of the sample 7 decreases and $\Delta V$ accordingly decreases. On the other hand, if $\Delta V$<Ecr−Eni, the movement of photoelectrons acts on $\Delta V$ in such a direction that $\Delta V$ increases. In sum, when $\Delta V \neq$Ecr−Eni, the movement of photoelectrons acts on $\Delta V$ in such a direction that $\Delta V$=Ecr−Eni is satisfied. When the movement reaches the equilibrium condition, $\Delta V$=Ecr−Eni. Consequently, the number of photoelectrons emitted from the sample 7 and the number of photoelectrons absorbed into the sample 7 becomes equal to each other, and accordingly becomes stable. For this reason, increase of the electrostatic charge stops.

The foregoing descriptions have been provided on the assumption that photoelectrons respectively emitted from the sample 7 and the photoelectron generating electrode 52 meet each other at the center position therebetween. As a whole, however, photoelectrons emitted respectively from the sample 7 and the photoelectron generating electrode 52 similarly behave even if the photoelectrons overlap each other at any other single position, when the sample 7 and the photoelectron generating electrode 52 share the same condition in terms of the number of emitted photoelectrons, the emission angle, the rate of photoelectron absorption and the like, except for the work function.

Consequently, the voltage between the sample 7 and the photoelectron generating electrode 52 becomes constant, and is expressed with $\Delta V$=Ecr−Eni. In this respect, if the electric potential of the photoelectron generating electrode 52 is arbitrarily set up, the electric potential of the sample 7 can be controlled to have a desired value. Specifically, a voltage Vd of a predetermined value is applied to the photoelectron generating electrode 52 by controlling the voltage controller 54. When this voltage Vd is set up so as to offset $\Delta V$, the electric potential of the sample 7 becomes equal to 0 V. In the case shown in FIG. 4, for instance, because $\Delta V$=0.2 [V], the voltage Vd is set at −0.2 [V].

Next, descriptions will be provided for the method of keeping the electric potential of the surface of the sample 7 constant. As described above, it is possible to keep the electric potential of the surface of the sample 7 constant by controlling the photoelectrons emitted by irradiation of the ultraviolet light onto the sample 7 and the photoelectron generating electrode 52, by use of a voltage applied to the photoelectron generating electrode 52.

Figure 5:
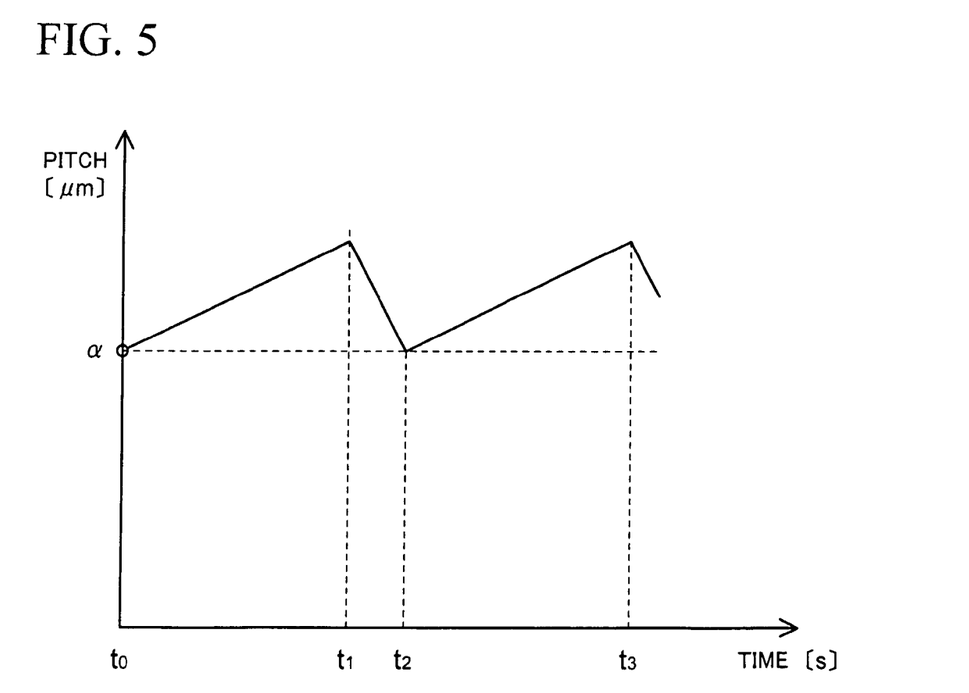
FIG. 5 is a diagram showing change in dimension measurement value over time.

FIG. 5 shows how a value representing the measurement of the sample 7 changes over time, in a case where the electric potential of the surface of the sample 7 is not constant.

Assume that the dimension of the sample 7 measured at time t0 is $\alpha$. While the dimension of the sample 7 is measured, the sample 7 is irradiated with an electron beam 9. As a result, the surface of the sample 7 is electrostatically charged, and the orbit of the electron beam 9 accordingly changes. For this reason, as shown in FIG. 5, for instance, a measured value representing the dimension becomes progressively larger over time than the actual value representing the dimension thereof.

With this taken into consideration, the process for keeping an electric potential constant is applied to the sample 7 at time t1 for the purpose of keeping the electric potential constant on the surface of the sample 7. This process for keeping an electric potential constant continues until a measured value representing the dimension thereof becomes equal to the value obtained by measuring the dimension thereof at time t0. In the case shown in FIG. 5, the process continues until time t2. Thereby, the measured value representing the dimension thereof returns to the value obtained at time t0. After that, the measurement of the dimension of the sample 7 and the process for keeping an electric potential constant are alternately repeated.

More specifically, first, a process for controlling the electric potential of electrostatic charge of the sample 7 to set the electric potential at 0 V is applied to the sample 7 before the dimension of the sample 7 is measured. This process is carried out in the following sequence. The sample 7 is moved into the process chamber 51, so that the photoelectron generating electrode 52 and the sample 7 are disposed to face each other. A voltage needed to control the electric potential of electrostatic charge of the sample 7 to 0 V is applied to the photoelectron generating electrode 52. In this state, the ultraviolet light irradiator 53 irradiates the sample 7 and the photoelectron generating electrode 52 with ultraviolet light for a predetermined length of time.

Whether or not the electric potential of the surface of the sample 7 has reached 0 V is judged in such a manner that the dimension of the sample 7 is actually measured and then a judgment is made as to whether or not this measured dimension of the sample 7 is equal to a previously measured dimension of a calibration sample, or whether or not the difference between this measured dimension of the sample 7 and the previously measured dimension of the calibration sample is within an allowable error range.

Once the electric potential of the surface of the sample 7 is determined as having reached 0 V, the sample 7 is moved into the sample chamber 16 in the electron-beam dimension measuring apparatus. Subsequently, the sample 7 is observed or the dimension of the sample 7 is measured.

In this manner, the voltage applied to the photoelectron generating electrode 52 capable of being grounded is controlled instead of the sample 7 which cannot be grounded. This makes it possible to control the electrostatic charge of the surface of the sample 7 to have the electrostatic charge of 0 V.

In the present embodiment, as described above, the electric potential on the sample 7 is kept constant before the dimension of the sample 7 is measured. For the purpose of keeping the electric potential on the sample 7 constant, both the sample 7 and the photoelectron generating electrode 52 are irradiated with ultraviolet light while the predetermined voltage is being applied to the photoelectron generating electrode 52 facing the sample 7 and capable of being grounded. Due to the irradiation of the ultraviolet light on the sample 7 and the photoelectron generating electrode 52, photoelectrons are emitted from the sample 7 and the photoelectron generating electrode 52. By use of the value representing the voltage to be applied to the photoelectron generating electrode 52, the electric potential of the surface of the sample 7 is controlled to have the electric potential of 0 V. The voltage applied to the photoelectron generating electrode 52 is a voltage for supplying photoelectrons with energy corresponding to the difference between the energy of photoelectrons emitted by the sample 7 due to the irradiation of the ultraviolet light. Thereby, the electron beam 9 is no longer influenced by a different electric potential on the surface of the sample 7, and accordingly the orbit of the electron beam 9 no longer changes. This makes it possible to measure the dimension of the sample 7 stably.

(Electron Beam Dimension Measuring Method)

Figure 6:
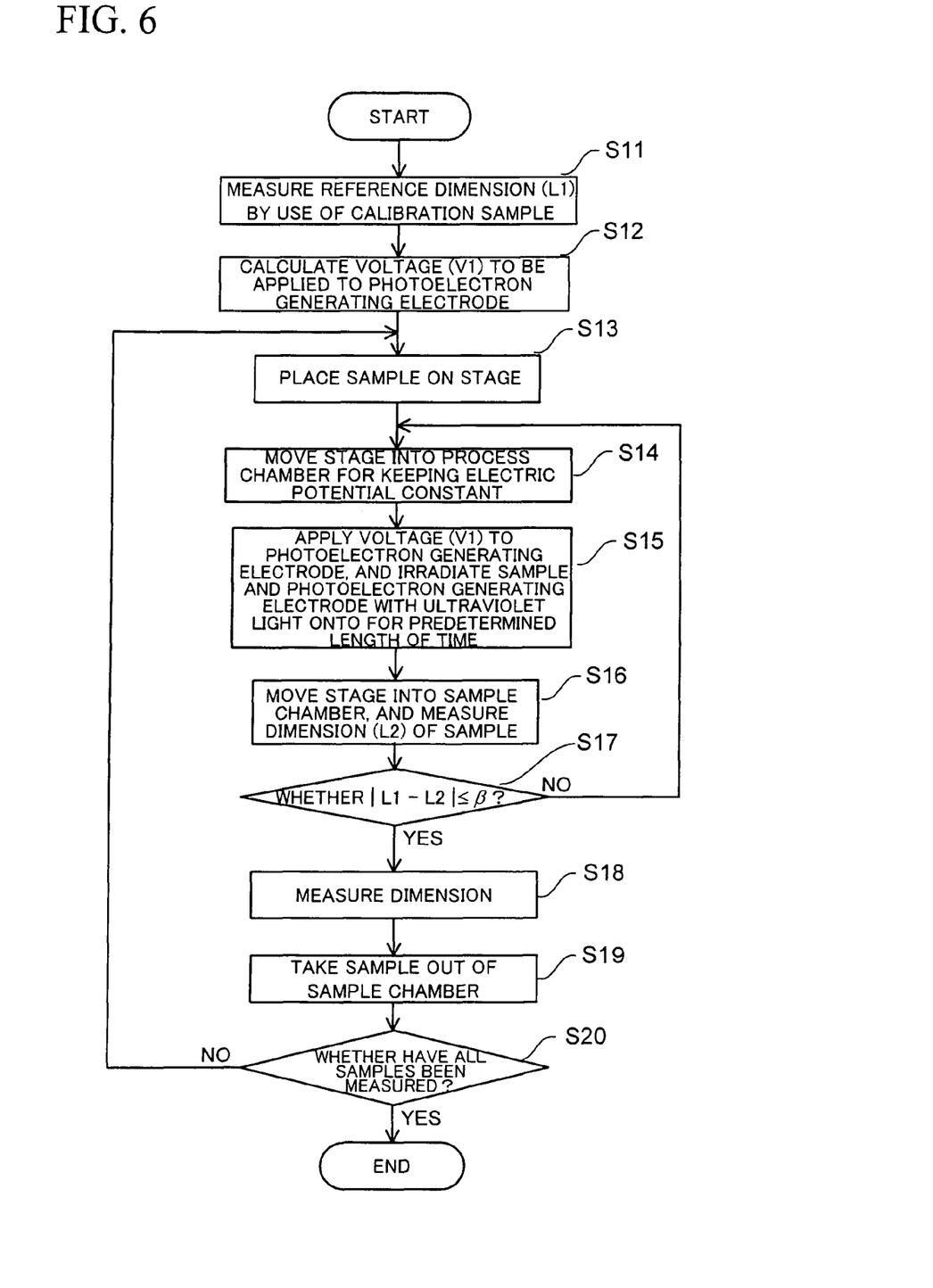
FIG. 6 is a flowchart showing an electron-beam dimension measuring method.

Next, with reference to a flowchart in FIG. 6, descriptions will be provided for a method of measuring the dimension of the sample 7, using the electron-beam dimension measuring apparatus 100 according to the present embodiment, by keeping the electric potential on the sample 7 constant.

First, in step S11, the reference dimension is measured with use of the calibration sample. A value representing the measured reference dimension is denoted by reference numeral L1. The calibration sample is made of the same material as the sample 7 which is a measurement object, and the dimension of the calibration sample is already known (for example, the pitches of a line-and-space pattern is already known). The calibration sample is grounded, and thus the electric potential of the calibration sample is 0 V. The dimension of the calibration sample is measured before the electric potential of the surface of the calibration sample changes. The dimension measurement is carried out as follows. The calibration sample is scanned while being irradiated with an electron beam. Thereby, an image of the calibration sample is acquired. The dimension of the calibration sample is measured from the image thus acquired.

The entire substrate of the calibration sample may be made of a conductor. Otherwise, the calibration sample may have a mechanism with which the calibration sample is temporarily grounded onto the stage. In a case where the calibration sample having the mechanism with which the calibration sample is temporarily grounded onto the stage is used, the reference dimension of the calibration sample is measured while the calibration sample is grounded onto the stage.

In an ensuing step S12, the voltage (denoted by V1) applied to the photoelectron generating electrode 52 is calculated. The voltage applied to the photoelectron generating electrode 52 is a voltage for supplying photoelectrons with energy corresponding to the difference between the energy of photoelectrons emitted from the sample 7 and the energy of photoelectrons emitted from the photoelectron generating electrode 52.

In an ensuing step S13, the sample 7 is placed on the stage 5 in the sample chamber 16.

In an ensuing step S14, the stage 5 is moved into the process chamber 51 for keeping an electric potential constant. The photoelectron generating electrode 52 and the sample 7 are disposed so as to face each other in such a way as to be separated away from each other by a predetermined distance. The photoelectron generating electrode 52 is disposed in such a way as to cover the entire surface of the sample 7.

In an ensuing step S15, the electric potential of the surface of the sample 7 placed on the stage 5 is controlled to 0 V. The voltage V1 is applied to the photoelectron generating electrode 52, and the sample 7 and the photoelectron generating electrode 52 are irradiated with ultraviolet light with a predetermined wavelength, for instance, 250 nm from the ultraviolet light irradiator 53. This irradiation is continuously carried out for a predetermined length of time, for instance, 10 seconds. Once the predetermined length of time passes, the irradiation of the ultraviolet light is stopped, and the application of the voltage to the photoelectron generating electrode 52 is stopped.

In an ensuing step S16, the stage 5 is moved from the process chamber 51 for keeping an electric potential constant to the sample chamber 16, where the dimension of the sample 7 is measured. The measured value is denoted by reference numeral L2.

In an ensuing step S17, it is judged whether or not the electric potential of the surface of the sample 7 becomes close to 0 V after the process for keeping an electric potential constant is applied to the sample 7. This judgment is made based on whether or not the difference between the measured value L1 of the calibration sample and the measured value L2 is less than a predetermined value, for instance, 0.1 nm. If the difference is equal to or less than the predetermined value, the process proceeds to step S18. If the difference is more than the predetermined value, it is determined that the electric potential of the surface of the sample 7 is not close to 0 V. The process returns to step S14, where the process for keeping an electric potential constant is applied to the sample 7 once again.

In an ensuing step S18, the dimension of the sample 7 in which the electric potential of the surface is controlled to be set at 0 V is measured.

In an ensuing step S19, the sample 7 whose dimension has been measured is taken out of the sample chamber 16.

In an ensuing step S20, it is judged whether or not the dimensions of all the samples 7 have been measured. If the dimensions of all the samples 7 have not been measured yet, the process returns to step S13. If the dimensions of all the samples 7 are determined as having been measured, this dimension measuring process is completed.

In this dimension measuring process, the dimension of the sample 7 is measured in step S18, and thereafter the sample 7 is taken out from the sample chamber 16 in step S19. Instead, however, the process for keeping an electric potential constant may be applied to the sample 7 each time a predetermined length of time has passed since the dimension measurement started. In this case, step S18 may be followed by another step, where it is judged whether or not a predetermined length of time, for instance, 5 minutes has passed since the dimension measurement started. In this respect, if the predetermined length of time has passed, the dimension measurement process returns to the step S14, where the electric potential of the surface of the sample 7 is controlled to 0 V. That is because, due to the irradiation of the electron beam on the sample during the dimension measurement, the sample again becomes positively or negatively charged over time. As a result, the electrostatic charge needs to be removed from the sample.

In the case of this dimension measuring process, if it is determined in step S20 that the dimensions of all the samples 7 have not been measured yet, the process returns to step S13, where the dimension measurement is continued. However, all the samples 7 being dimension measurement objects are not necessary the same. For this reason, when the materials of the samples 7 are different, this process may return to step S11, instead of step 13, where the reference dimension is measured by use of the calibration sample.

In the case of the measurement method using the electron-beam dimension measurement apparatus 100 according to the present embodiment, as described above, the electric potential on the sample 7 is kept constant before the dimension of the sample 7 is measured. For the purpose of keeping the electric potential constant, both the sample 7 and the photoelectron generating electrode 52 are irradiated with the ultraviolet light while the predetermined voltage is being applied to the photoelectron generating electrode 52 which is facing the sample 7, and which is grounded. Due to the irradiation of the ultraviolet light on the sample 7 and the photoelectron generating electrode 52, photoelectrons are emitted from the sample 7 and the photoelectron generating electrode 52. With use of the value representing the voltage applied to the photoelectron generating electrode 52, the electric potential of the surface of the sample 7 is controlled to 0 V. Thereby, the electron beam is no longer influenced by a different electric potential on the sample, and accordingly the orbit of the electron beam no longer changes. This makes it possible to measure the dimension of the sample stably.

The foregoing descriptions have been provided for the present embodiment directed to the case of the electron-beam dimension measurement apparatus which carries out the process for keeping an electric potential constant. However, the present embodiment is not limited to this embodiment. The present invention can be applied to an apparatus which needs to keep the electric potential of a sample constant when the sample is placed in vacuum. The present invention can be applied to an FIB (Focused Ion Beam) system and an Auger spectroscope, for instance.

In addition, the foregoing descriptions have been provided for the present embodiment by taking the case where the sample is made of chromium. However, the present invention is not limited to the case where the sample is made of a metal in a floating state. The present invention can be applied to a case where the sample is a resist, if damage which occurs in the resist due to emitted ultraviolet light is negligible.

Furthermore, in a case where the material for the sample is unknown, or in a case where a calibration sample made of the same material as the sample cannot be ready to use, the voltage applied to the photoelectron generating electrode 52 may be controlled in order that a measured value representing the pitch of already-known interconnections on the sample can be equal to an already-known value. Generally speaking, in the case of the pitch, the adoption of this method causes no practical problem, as long as the pitch precision is high, the quality of the material for the sample is homogeneous, as well as the emission energy and emission distribution of photoelectrons is constant.

(Modification)

The foregoing descriptions have been provided for the present embodiment directed to the case where the process for keeping an electric potential constant is applied to the sample after the sample is moved from the sample chamber 16 to the process chamber 51 for keeping an electric potential constant. However, the present invention is not limited to this embodiment. The process for keeping an electric potential may be carried out within the sample chamber 16 instead as shown in FIG. 7.

Figure 7:
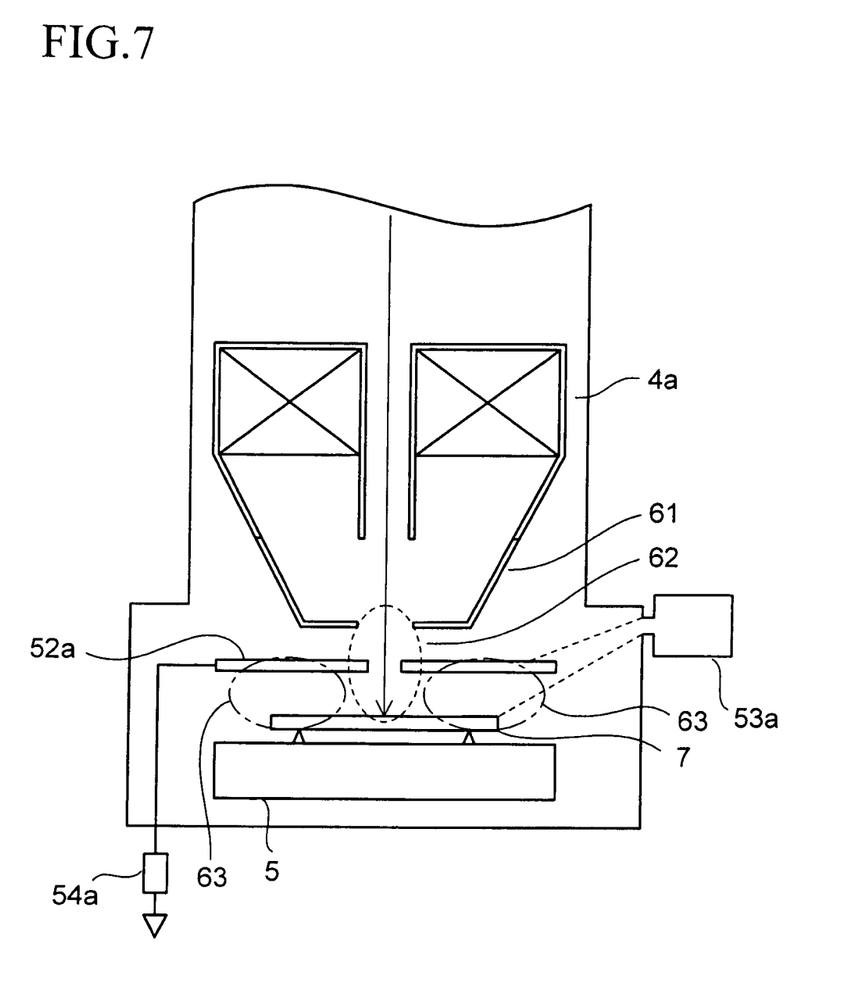
FIG. 7 is a diagram (Part 2) showing the processor for keeping an electric potential constant in the electron-beam dimension measuring apparatus shown in FIG. 1.

FIG. 7 is a diagram showing a part of the electron-beam dimension measurement apparatus in which a photoelectron generating electrode 52a is disposed under an objective lens 4a. As shown in FIG. 7, the objective lens 4a includes an electrostatic lens 61 which is disposed at its lower end opposed to the sample 7. In a case where the objective lens 4a of this type is used, an arrangement needs to be made in order that a range of the electric field produced by the objective lens 4a is not irradiated with ultraviolet light. When a voltage is applied to the objective lens 4a, an electric field 62 occurs due to the objective lens 4a. The electric field 62 functions to make the electron beam thinner. For this reason, if the distribution of the electric field is disturbed, the focal length of the objective lens 4a is adversely affected. With this taken into consideration, when the process for keeping an electric potential is carried out, it is preferable that the ultraviolet light is emitted without applying any voltage to the objective lens 4a.

Note that the ultraviolet light has a high directivity, and that it is accordingly easy to irradiate only a desired position with the ultraviolet light. For this reason, even when a voltage is applied to the objective lens 4a, it is possible to carry out a process for keeping the electric potential of the sample 7 constant by irradiating the ultraviolet light onto a range 63 which is located beyond the influence of the electric field of the objective lens 4a.

What is claimed is:

1. An electron-beam dimension measuring apparatus comprising:
   electron-beam irradiating means for irradiating a surface of a sample with an electron beam;
   a stage on which the sample is placed;
   a photoelectron generating electrode disposed so as to face the sample;
   ultraviolet light irradiating means for emitting ultraviolet light; and
   control means controls operations of:
      measuring a dimension of a calibration sample of known dimension by irradiating the electron beam thereon where the calibration sample is grounded so that its surface potential is 0 V,
      causing the ultraviolet light irradiating means to irradiate both the sample and the photoelectron generating electrode with the ultraviolet light at the same time for a predetermined length of time, to cause the sample and the photoelectron generating electrode to emit photoelectrons,
      measuring a dimension of the sample by irradiating the electron beam thereon,
      applying a voltage to the photoelectron generating electrode in such a way that the measured dimension of the sample becomes identical to or within a predetermined difference from the measured dimension of the calibration sample, where the voltage differs from 0 V by a difference between energy of photoelectrons emitted by the sample and energy of photoelectrons emitted by the photoelectron generating electrode, and
      thereby controlling an electric potential of the surface of the sample to 0 V.

2. The electron-beam dimension measuring apparatus according to claim 1, wherein
   the predetermined length of time is a time length required until a first measurement value and a second measurement value become equal to each other, where the first measurement value is obtained by measurement of the dimension of the calibration sample and the second measurement value is obtained by measuring the dimension of the sample after irradiating the sample with the ultraviolet light.

3. The electron-beam dimension measuring apparatus according to claim 1, wherein
   the ultraviolet light has energy larger than a work function of the sample and a work function of the photoelectron electrode.

4. The electron-beam dimension measuring apparatus according to claim 1, wherein
   the photoelectron generating electrode is disposed so as to face the sample in such a way as to cover an entire surface of the sample.

5. The electron-beam dimension measuring apparatus according to claim 1, further comprising
   an objective lens with an electrostatic lens disposed at a lower end portion of the objective lens,
   wherein the control means causes the ultraviolet light irradiating means to emit the ultraviolet light without applying any voltage to the objective lens.

6. The electron-beam dimension measuring apparatus according to claim 1, further comprising
   an objective lens with an electrostatic lens disposed at a lower end portion of the objective lens,
   wherein the control means causes the ultraviolet light irradiating means to irradiate, with the ultraviolet light, a range not influenced by an electric field generated by applying a voltage to the objective lens, in the sample and photoelectron generating electrode.

7. The electron-beam dimension measuring apparatus according to claim 1, wherein
   the control means measures various dimensions of the sample after establishing the constant electric potential of 0 V on the surface of the sample.

8. An electron-beam dimension measuring method for an electron-beam dimension measuring apparatus including: electron-beam irradiating means for irradiating an electron beam onto a surface of a sample; a stage on which the sample is placed; a photoelectron generating electrode disposed so as to face the sample; and ultraviolet light irradiating means for emitting ultraviolet light,
   the method comprising the steps of:
      measuring a dimension of a calibration sample of known dimension by irradiating the electron beam thereon where the calibration sample is grounded so that its surface potential is 0 V
      causing the ultraviolet light irradiating means to irradiate both the sample and the photoelectron generating electrode with the ultraviolet light at the same time for a predetermined length of time, to cause the sample and the photoelectron generating electrode to emit photoelectrons,
      measuring a dimension of the sample by irradiating the electron beam thereon,
      applying a voltage to the photoelectron generating electrode in such a way that the measured dimension of the sample becomes identical to or within a predetermined difference from the measured dimension of the calibration sample, where the voltage differs from 0 V by a difference between energy of photoelectrons emitted by the sample and energy of photoelectrons emitted by the photoelectron generating electrode, and
      thereby controlling an electric potential of the surface of the sample to 0 V.

9. The electron-beam dimension measuring method according to claim 8, wherein
   the predetermined length of time is a time length required until a first measurement value and a second measurement value become equal to each other, where the first measurement value is obtained by measurement of the dimension of the calibration sample and the second measurement value is obtained by measuring the dimension of the sample after irradiating the sample with the ultraviolet light.

10. The electron-beam dimension measuring method according to claim 8, wherein
   the ultraviolet light has energy larger than a work function of the sample and a work function of the photoelectron electrode.

* * * * *